United States Patent
Vaidyanathan et al.

(10) Patent No.: US 8,073,409 B2
(45) Date of Patent: *Dec. 6, 2011

(54) SYSTEM AND METHOD FOR CONTROLLING TRANSMITTER OUTPUT LEVELS IN A WIRELESS COMMUNICATIONS DEVICE

(75) Inventors: Rema Vaidyanathan, San Diego, CA (US); Guda Srinivas, San Diego, CA (US)

(73) Assignee: Kyocera Corporation, Kyoto (JP)

(*) Notice: Subject to any disclaimer, the term of this patent is extended or adjusted under 35 U.S.C. 154(b) by 1450 days.

This patent is subject to a terminal disclaimer.

(21) Appl. No.: 11/539,862

(22) Filed: Oct. 9, 2006

(65) Prior Publication Data

US 2007/0096824 A1    May 3, 2007

Related U.S. Application Data

(62) Division of application No. 09/976,600, filed on Oct. 12, 2001, now Pat. No. 7,120,401.

(51) Int. Cl.
*H04B 1/04* (2006.01)
(52) U.S. Cl. .................. 455/127.1; 455/522; 455/114.1
(58) Field of Classification Search ..... 455/127.1–127.5, 455/126, 115.1–115.4
See application file for complete search history.

(56) References Cited

U.S. PATENT DOCUMENTS

| | | | |
|---|---|---|---|
| 5,323,329 A | 6/1994 | Keane | |
| 5,655,220 A * | 8/1997 | Weiland et al. | 455/69 |
| 5,732,334 A * | 3/1998 | Miyake | 455/126 |
| 5,838,733 A * | 11/1998 | Bruckert | 455/126 |
| 6,223,056 B1 | 4/2001 | Appel | |
| 6,236,863 B1 * | 5/2001 | Waldroup et al. | 455/522 |
| 6,298,222 B1 * | 10/2001 | Bergveld et al. | 455/127.5 |
| 6,304,749 B1 * | 10/2001 | Obara | 455/126 |
| 6,819,938 B2 * | 11/2004 | Sahota | 455/522 |
| 6,987,954 B2 * | 1/2006 | Nielsen | 455/114.3 |
| 7,046,974 B2 * | 5/2006 | Yamaguchi | 455/127.1 |
| 7,120,401 B2 * | 10/2006 | Vaidyanathan et al. | 455/127.1 |

* cited by examiner

*Primary Examiner* — Lana N Le

(57) ABSTRACT

A system and method are disclosed for controlling transmitter output levels in a wireless communications device. The system comprises: a transmitter configured to accept an adjusted transmit bias control value and to supply a transmitter output level in response to the adjusted transmit bias control value; and a gain control circuit configured to supply the adjusted transmit bias control value in response to a transmitter output measurement and to a reference. The gain control circuit comprises a measuring circuit configured to accept the transmitter output level and to supply a transmitter output measurement, a table of initial transmit bias control values cross-referenced to transmitter output levels, the table configured to accept a transmitter output level selection and to supply an initial transmit bias control value in response to the transmitter output level selection, and, a compensator configured to accept the adjusted transmit bias control value and the initial transmit bias control value and to supply a compensated transmit bias control value based on a difference between the adjusted bias control value and the initial transmit bias control value.

9 Claims, 4 Drawing Sheets

SYSTEM AND METHOD FOR CONTROLLING TRANSMITTER OUTPUT LEVELS IN A WIRELESS COMMUNICATIONS DEVICE

RELATED APPLICATIONS

This is a division of U.S. application Ser. No. 09/976,600, filed Oct. 12, 2001 now U.S. Pat. No. 7,120,401, which is hereby incorporated by reference.

TECHNICAL FIELD

This invention generally relates to automatic gain control (AGC) circuits and, more particularly, to a system and method for compensating the error in voltage values used in biasing an advanced mobile phone service (AMPS) wireless communications device transmitter.

BACKGROUND

The output signal from transmitter circuitry, such as a power amplifier used to transmit signals in a wireless communications device, is inherently sensitive to changes in temperature, operating frequency and lot variations. As a result, it is well known to employ an AGC circuit to adjust the transmitter output level for more accurate output. In an AGC circuit, typically the transmitter output level is sampled and converted into a dc voltage, with the dc voltage used to set a feedback signal to adjust the output level from a power amplifier.

FIG. 1 is a schematic block diagram of a conventional transmitter with an AGC loop (prior art). An RF signal is received and amplified by transmitter circuitry, with the amplified signal used to drive an antenna. The amplified signal is also measured by a measuring circuit to provide a transmitter output measurement. The transmitter output measurement is fed into an operational amplifier (op amp), which is typically part of a loop filter (not shown). The transmitter output measurement is compared to a reference voltage level that represents the desired transmitter output measurement value. Responsive to the comparison, the op amp generates an adjusted transmit bias control value, which is then fed into the transmitter as an amplifier bias. The op amp is used to adjust the amplifier bias voltage until the transmitter output measurement voltage is substantially equal to the desired reference voltage.

It may be desirable to enable the transmitter to operate at a plurality of output levels. For example, the transmitter may be set to have a gain of 0, 3, 6, or 12 decibels (dB). At each predefined output level the AGC will typically use a corresponding reference voltage to compare against the measured transmitter output voltage. Alternately, the transmitter output measurement can be attenuated or amplified to correspond with the desired transmitter output for each predefined level. Although the AGC loop is shown as an analog circuit, it is also well known to convert the voltage levels to binary values and to operate the loop as a digital circuit. It should be understood that many variations of AGC loops exist, but the principle of stabilizing upon a reference is common to all the variations.

The process of stabilizing the transmitter output with an AGC loop takes time. The time delay in stabilizing the output is dependent on several factors, including the initial amplification error and how accurately the output level must be set. The AMPS specification requires that the transmitter output level settle to a specified power level within 20 milliseconds. To speed signal stabilization, it is well known to provide an initial transmit bias control value, which is an estimated initial transmitter output measurement value. An initial transmit bias control value may be set for each desired transmit output level. Accordingly, each time the transmitter is set to operate at a different output level, the initial transmit bias control value associated with that output level is used to facilitate timely stabilization.

Typically, transmit bias control values are determined and set using a calibration procedure. In this regard, each transmitter may be tested and assigned control values, or transmit bias control values may be set for a lot of transmitters. The bias control value(s) assigned to the transmitters are then typically stored in a non-volatile memory. In practice it is desirable to perform calibration in an environment that approximates the typical operating conditions of the transmitter. In this way the bias control values will better reflect the initial adjustment needed to stabilize the transmitter output signal.

As the AGC circuit operates to stabilize the transmitter output signal at a predefined level, the initial transmit bias control value is switched out of the circuit. Alternately, the op amp may be designed to provide higher gain for the actual transmitter output measurement, essentially ignoring the initial transmit bias control value when the op amp input values are close.

However, the initial transmit bias control values may be subject to substantial inaccuracies, reducing the effectiveness of the initial transmit bias control value and increasing the time delay in stabilizing the transmitter output signal. For example, variations between transistor lots, ambient operating temperature, battery voltage, transistor junction temperature, and the heatsink (wireless device circuit board) temperature lead to inaccuracies in the supplied transmit bias initial values. Since the size of wireless devices, especially mobile telephones, continues to shrink, the inaccuracies introduced as a result of heatsink, and ultimately junction temperature continue to be a problem. Inaccurate initial transmit bias values or changing environmental conditions limit the ability of an AMPS mode wireless telephone to operate within specifications.

It would be advantageous if a wireless communications device operating in AMPS mode could acquire the steady state transmitter output level quickly even in changing environmental conditions.

SUMMARY

The present invention facilitates efficiently stabilizing the output from a transmitter that is operating in a wireless communications device. The effects of inaccuracies in initial transmit bias control values are reduced by adapting the AGC circuit to environmental effects such as changes in the transmitter temperature.

Accordingly, a method is provided for controlling transmitter output levels in a wireless communications device The system comprises: a transmitter configured to accept an adjusted transmit bias control value and to supply a transmitter output level in response to the adjusted transmit bias control value; and a gain control circuit configured to supply the adjusted transmit bias control value in response to a transmitter output measurement and to a reference. The gain control circuit comprises a measuring circuit configured to accept the transmitter output level and to supply a transmitter output measurement, a table of initial transmit bias control values cross-referenced to transmitter output levels, the table configured to accept a transmitter output level selection and to supply an initial transmit bias control value in response to the transmitter output level selection, and, a compensator configured to accept the adjusted transmit bias control value and the initial transmit bias control value and to supply a compensated transmit bias control value based on a difference between the adjusted bias control value and the initial transmit bias control value.

Additional details of the above-described method, and a system for controlling transmitter output levels in a wireless communications device are presented below.

DETAILED DESCRIPTION OF THE INVENTION

Figure 1:
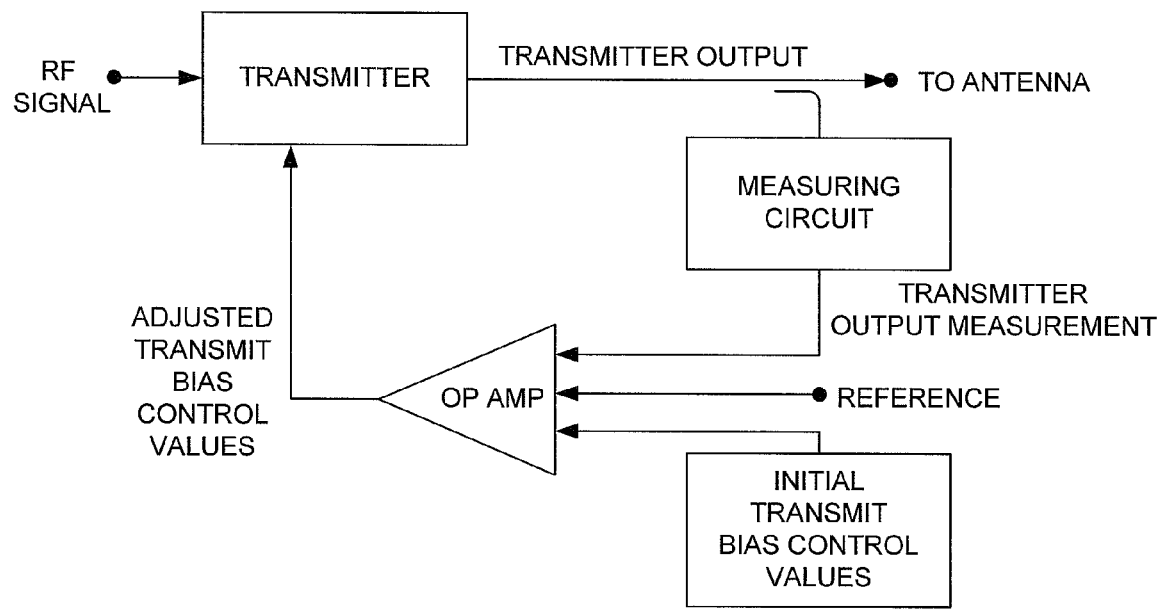
FIG. 1 is a schematic block diagram of a conventional transmitter with an AGC loop.
Figure 2:
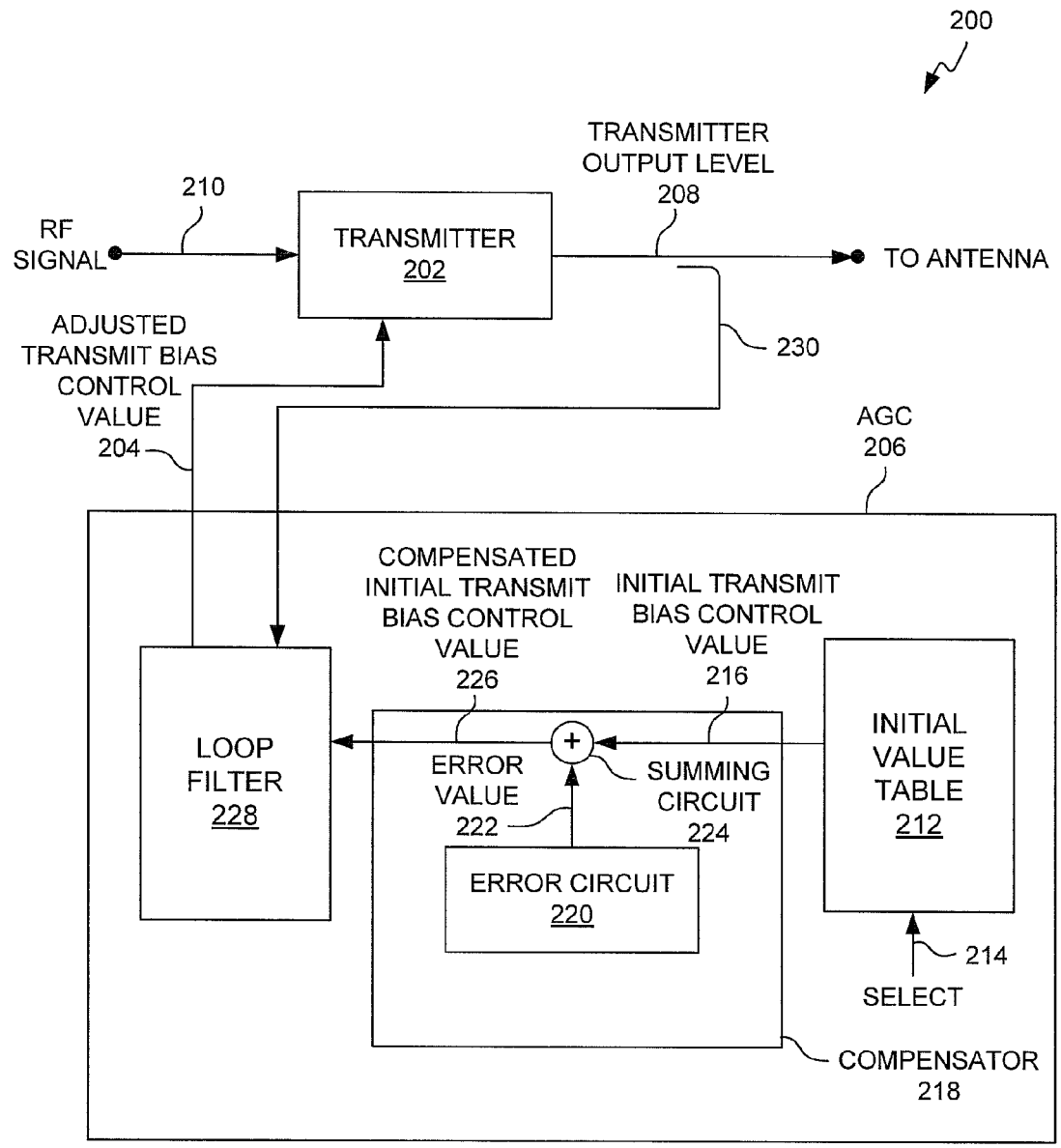
FIG. 2 is a schematic block diagram of a system for controlling transmitter output levels in a wireless communications device in accordance with the present invention.

FIG. 2 is a schematic block diagram of a system 200 for controlling transmitter output levels in a wireless communications device in accordance with the present invention. A transmitter 202 has an input on line 204 accepting a transmit bias control value from an automatic gain control (AGC) circuit 206. The transmit bias control value is used to control the transmitter output level. Transmitter 202 has an output on line 208 supplying a transmitter output level responsive to the transmit bias control value. The transmitter 202 accepts an RF signal on line 210 from previous blocks or circuits (not shown).

The AGC 206 includes a table 212 of initial transmit bias control values cross-referenced to transmitter output levels. Wireless communications devices, such as wireless telephones, operate at specified and controlled transmitter output levels. Accordingly, table 212 has an input to accept transmitter output level selections on line 214 and an output supplying initial transmit bias control values on line 216 in response to the transmitter output level selections. The transmit bias control values are typically supplied assuming standard ambient conditions for the wireless communications device.

A compensator 218 includes an error circuit 220 to provide an error value on line 222. The compensator 218 also has a summing circuit 224 with an input accepting the error value, an input accepting an initial transmit bias control value on line 216, and an output to supply the initial transmit bias control value compensated for error on line 226. A loop filter 228 has an input accepting the compensated initial transmit bias control value, an input accepting the transmitter output level on line 230, and an output supplying the adjusted transmit bias control value on line 204.

Figure 3:
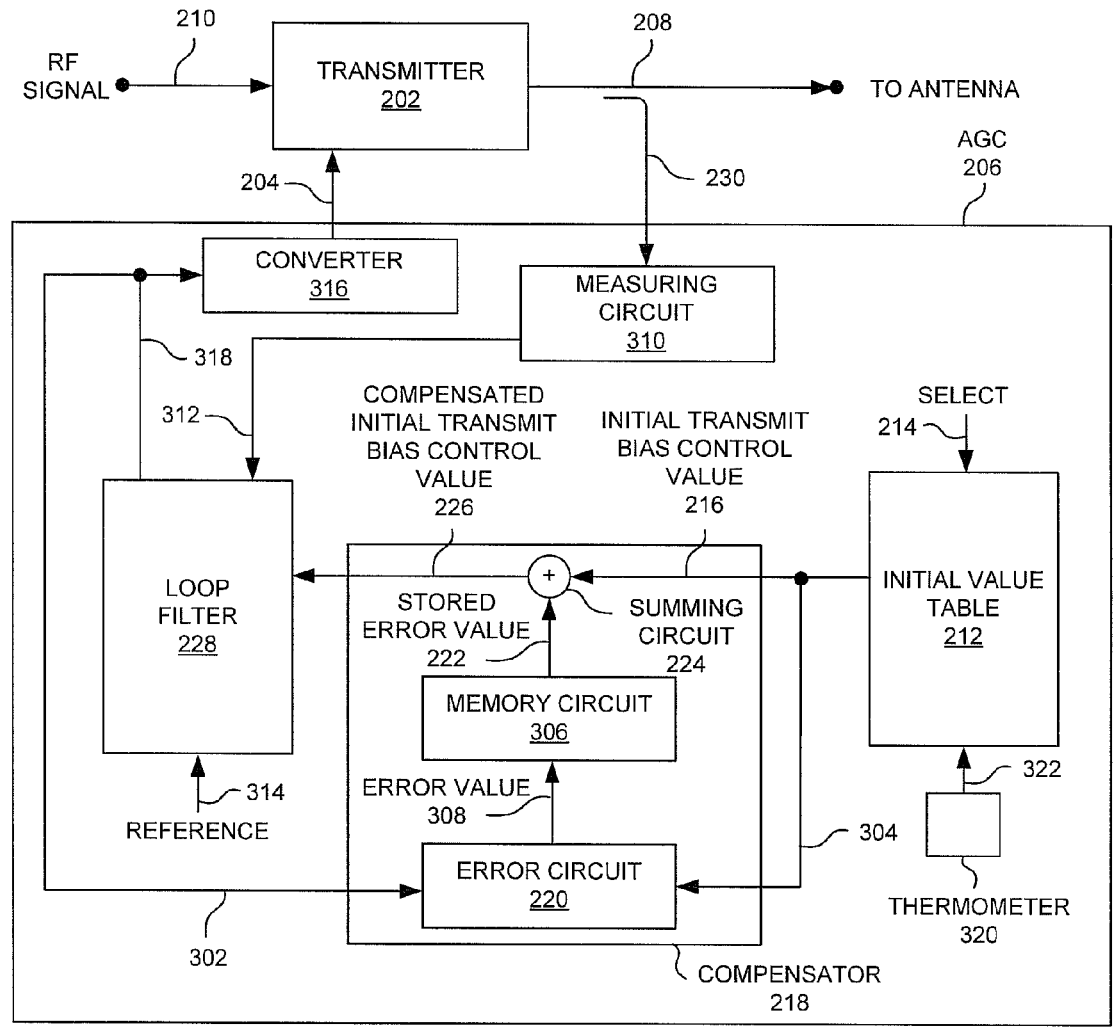
FIG. 3 is a schematic block diagram depicting in further detail the system of FIG. 2.

FIG. 3 is a schematic block diagram depicting in further detail the system 200 of FIG. 2. The error circuit 220 has an input connected to the loop filter 228 output on line 302, an input accepting initial transmit bias control values from the table 212 on line 304, and an output supplying an error value associated with the initial transmit bias control value. The compensator 218 also includes a memory circuit 306 having an input accepting the error value on line 308 and an output supplying a stored error value. The summing circuit 224 has an input accepting the stored error on line 222, an input accepting a subsequent initial transmit bias control value from the table 212 on line 216, and an output to supply the subsequent initial transmit bias control value compensated for error on line 226.

A measuring circuit 310 has an input on line 230 accepting the transmitter output level and an output on line 312 supplying a transmitter output measurement to the loop filter 228. Typically, the transmitter output level is sampled through an isolator, coupler, or an equivalent device (not shown). The loop filter 228 supplies adjusted transmit bias control values on line 204 responsive to the transmitter output measurement, as well as to a reference on line 314. The transmitter 202 generates selected transmitter output levels on line 208 in response to the adjusted transmit bias control values on line 204.

In some aspects of the system 200, significant portions of the AGC 206 include digital circuitry. Then, the AGC 206 also includes a converter 316 with an input connected to the output of the filter loop 228 on line 318 to receive digital signals and an output supplying a control voltage on line 204. The transmitter 202 input accepts the converter output as a biasing signal on line 204. The filter loop 228, converter 316, and measuring circuit 310 perform conventional loop acquisition functions.

In some aspects of the system 200, the wireless communications device is a wireless telephone operating in an analog mode. Therefore, the table 212 accepts transmitter output levels in accordance with advanced mobile phone service (AMPS) specifications. Transmitter loop acquisition typically is important in the operation of wireless communications devices. In particular, the minimization of the time required to attain a specified transmitter output level after that output level has been selected is desirable. In accordance with advanced mobile phone service (AMPS) specifications, the transmitter 202 generates the selected transmitter output level on line 208 within 20 milliseconds.

In some aspects, the system 200 described in FIGS. 2 and 3 can be an analog system or a hybrid analog and digital system. The measuring circuit 310 accepts the transmitter output level on line 230 as a voltage and supplies the transmitter output measurement on line 312 as a binary number. Likewise, the table 212 includes initial transmit bias control values stored as binary numbers.

explained above, the operation of the wireless communications device is affected by a variety of ambient conditions, such as air temperature and heatsink (and therefore, transistor junction) temperature. Therefore, in some aspects of the system 200, a thermometer 320 is used to supply more accurate initial transmit bias control values. In some aspects of the system 200, the thermometer 320 is mounted on the power transistor or on the circuit board proximate to the power amplifier transistor. The thermometer 320 has an output supplying temperature data. The table 212 has an input to accept the temperature data on line 322. The table 212 cross-references initial transmit bias control values to temperature. That is, the initial transmit bias control values are adjusted to account for differences in the operation of the wireless communications device circuitry at various temperatures.

The operation of the wireless communications device also is affected by the frequency of the transmitter output level. Therefore, in some aspects of the system 200, the capability of selecting the transmitter output frequency is used to supply a more accurate initial transmit bias control value. The table 212 includes initial transmit bias control values cross-referenced to transmitter output frequency. The table 212 has an input to accept transmitter output frequency selections on line 214.

The numeric values used in the following example are for purposes of illustration only, and are not meant to reflect actual operating values for a wireless communications device. Note that values in the table, compensator, and calculator are binary numbers in a preferred embodiment of the invention. However, to simplify the following example, the analog equivalents for these binary numbers are used.

Assume the wireless communications device begins operation in an initial state. Further assume there is no error information in the initial state that can be used to adjust or compensate the transmit bias control values (e.g., the device has been turned off for an appreciable length of time, and any error values in storage may not be applicable to current ambient conditions). A desired transmitter output level is selected as an input to the table, and the table outputs an initial transmit bias control value. This initial transmit bias control value is not modified by the compensator. That is, there is no applicable error value. However, since the operations of wireless communications devices is sensitive to variations in transistor lots, ambient operating temperature, battery voltage, transistor junction temperature, and the heatsink temperature, it is safe to assume the initial transmit bias control value is inaccurate. Therefore, the measuring circuit, calculator and the converter operate to modify the transmitter output level as needed to provide the selected transmitter output level. In other aspects of the system 200, the last error value is saved before the wireless communications device is shut down, and the initial transmit bias control value is compensated with this error value.

Assume a desired transmitter output level of 20 dBm is selected for the initial operating state, and that the table has a corresponding initial transmit bias control value of +2.0 volts. Due to variations in the actual ambient conditions mentioned above, the transmit bias control value of +2.0 volts produces a transmitter output level of only 19 dBm in response to the initial transmit bias control value. The measuring circuit, calculator, and the converter adjust the transmit bias control value until the transmitter output level reaches 20 dBm. The adjusted transmit bias control value is then +2.5 volts. Therefore, the error value for the initial transmit bias control value is +0.5 volts, and this value is stored in the memory circuit.

In practice, the error value is continually updated in the memory circuit as the transmitter output level is sampled, and calculations made at periodic intervals. Once operation of the wireless communications device stabilizes at the first transmitter output level, it is likely that the error value will change as the wireless communications device warms up. These changes in the error value, however, will be updated. Note that the error value for the first transmit bias control value does not provide information useful to the AGC loop until a second initial transmit bias control value is supplied by the table.

Now assume a second transmitter output level is selected, and the table supplies a corresponding second initial transmit bias control value. Initial transmit bias control values are typically determined assuming standard ambient conditions. Therefore, to the extent that the first initial transmit bias control value was inaccurate due to variations from the standard ambient conditions, the second initial transmit bias control value also is inaccurate. The error value for the first initial transmit bias control value is therefore a good approximation of the correction needed for the second initial transmit bias control value to produce the desired power transmitter output level assuming similar variations from the standard ambient conditions.

Continuing the numeric example, assume that the second transmitter output level is 24 dBm, and that the corresponding initial transmit bias control value in the table is +3.0 volts. The compensator adds +0.5 volts (the error in storage) to the second initial transmit bias control value to produce a compensated transmit bias control value of +3.5 volts. Assuming that a transmit bias control value of +3.6 volts is actually needed to produce the desired transmitter output level, beginning the AGC loop acquisition calculations at +3.5 volts rather than at +3.0 volts reduces the amount of time needed for the AGC loop to produce the adjustments needed in the biasing signal to produce the desired transmitter output level.

This last portion of the example illustrates an important feature of the invention: reducing AGC loop acquisition time by allowing the AGC loop to begin calculations with an initial transmit bias control value closer to the transmit bias control value actually needed to produce the selected transmitter output level.

Figure 4:
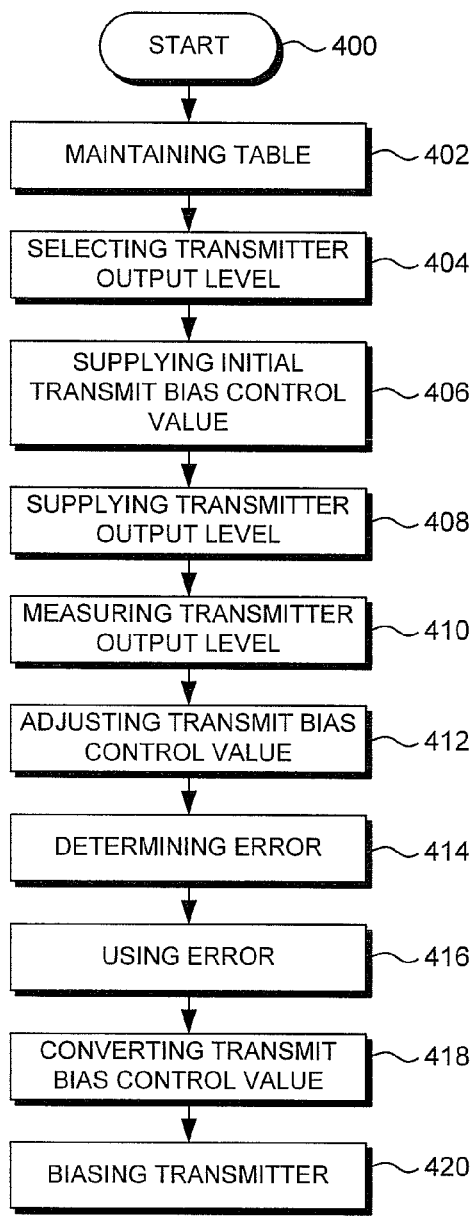
FIG. 4 is a flowchart illustrating the method for controlling transmitter output levels in a wireless communications device in accordance with the present invention.

FIG. 4 is a flowchart illustrating the method for controlling transmitter output levels in a wireless communications device in accordance with the present invention. Although the method in FIG. 4 (and FIG. 5 below) is depicted as a sequence of numbered steps for clarity, no order should be inferred from the numbering unless explicitly stated. The method starts at step 400. Step 402 maintains a table of initial transmit bias control values cross-referenced to transmitter output levels. Step 404 selects a transmitter output level. Step 406 supplies a corresponding initial transmit bias control value. Step 408 generates an initial transmitter output level. Step 410 measures the transmitter output level. Step 412 adjusts the transmit bias control value until the transmitter output level equals the selected transmitter output level. Step 414 determines an error in a transmit bias control value. Step 416 uses the error to compensate a subsequent initial transmit bias control value.

In some aspects of the method, supplying an initial transmit bias control value in Step 406 includes supplying an initial transmit bias control value from the table corresponding to a selected transmitter output level. Then, using the error to compensate a subsequent initial transmit bias control value in Step 416 includes adding the error to an initial transmit bias control value from the table.

In some aspects of the method, a further step, Step 401 (not shown), measures temperature. Then, maintaining a table of initial 5 transmit bias control values cross-referenced to selected transmitter output levels in Step 402 includes cross-referencing the initial transmit bias control values to temperature, and supplying a corresponding initial transmit bias control value in Step 406 includes supplying an initial transmit bias control value from the table in response to the temperature.

In some aspects of the method, selecting a transmitter output level in Step 404 includes selecting a transmitter output frequency. Then, maintaining a table of initial transmit bias control values cross-referenced to selected transmitter output levels in Step 402 includes cross-referencing the initial transmit bias control values to transmitter output frequencies, and supplying a corresponding initial transmit bias control value in Step 406 includes supplying an initial transmit bias control value from the table in response to the transmitter output frequency.

In some aspects of the method the wireless communications device operates in an analog mode. Then, selecting a transmitter output level in Step 404 includes selecting transmitter output levels in accordance with advanced mobile phone service (AMPS) specifications, and adjusting the transmit bias control value until the transmitter output level equals the selected transmitter output level in Step 412 includes achieving the selected transmitter output level within 20 milliseconds.

In some aspects of the method, measuring the transmitter output level in Step 410 includes converting the transmitter output voltage to a binary number. Likewise, maintaining a table of transmit bias control values cross-referenced to selected transmitter output levels in Step 402 includes storing the transmit bias control values as binary numbers.

In some aspects of the invention, using the error to compensate a subsequent initial transmit bias control value in Step 416 includes summing the error with the corresponding initial transmit bias control value to create a compensated transmit bias control value. Then, adjusting the transmit bias control value until the transmitter output level equals the selected transmitter output level in Step 412 includes adjusting the compensated transmit bias control value in response to the measured transmitter output level, and to a reference value to create an adjusted transmit bias control value. A further step, Step 418, converts the adjusted transmit bias control value to a control voltage. Step 420 uses the control voltage to bias the transmitter.

In some aspects of the method, determining an error in a transmit bias control value in Step 414 includes comparing an initial transmit bias control value and a corresponding adjusted transmit bias control value, using the difference between the initial transmit bias control value and the corresponding adjusted transmit bias control value to create an error value, and saving the error value. Then, using the error to compensate a subsequent initial transmit bias control value in Step 416 includes adding the error value to a subsequent initial transmit bias control value.

Figure 5:
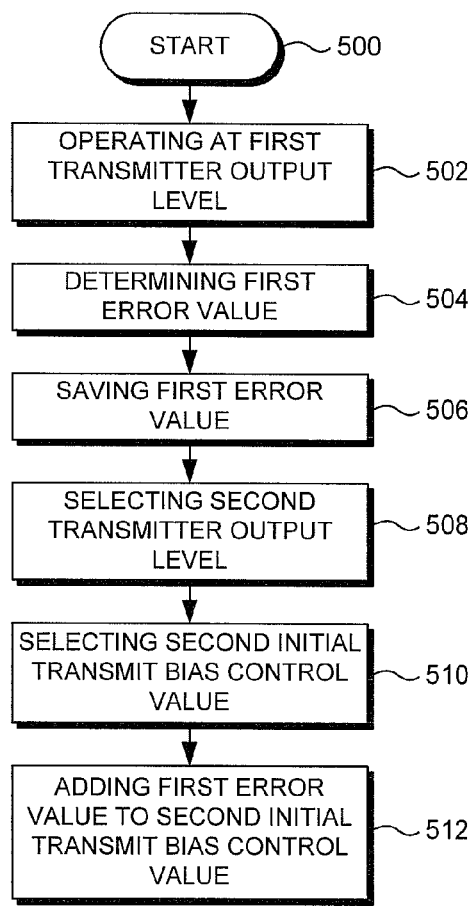
FIG. 5 is a flowchart illustrating the method for compensating an initial transmit bias control value in accordance with the present invention.

FIG. 5 is a flowchart illustrating the method for compensating an initial transmit bias control value in accordance with the present invention. The method starts at Step 502. Step 502 operates at a first transmitter output level. Step 504 determines a first error value in a first initial transmit bias control value associated with the first transmitter output level. Step 506 saves the first error value. Step 508 selects a second transmitter output level. Step 510 selects a second initial transmit bias control value corresponding to the second transmitter output level. Step 512 adds the first error value to the second initial transmit bias control value to create a second compensated initial transmit bias control value.

A system and method are provided for controlling transmitter output levels in a wireless communications device. The system and method are applicable to a wide range of equivalent devices where it is desirable to reduce AGC loop acquisition time. For example, devices where variations in transistor lots, ambient operating temperature, battery voltage, transistor junction temperature, and the heatsink temperature cause inaccuracies in the process of acquiring the AGC signal. The system and method would also be applicable to frequency locked loops where initial control values are used to aid in loop acquisition. Other variations and embodiments of the invention will occur to those skilled in the art.

What is claimed is:

1. In a wireless communications device, a system for controlling transmitter output levels, the system comprising:
   a transmitter configured to accept an adjusted transmit bias control value and to supply a transmitter output level in response to the adjusted transmit bias control value; and,
   a gain control circuit configured to supply the adjusted transmit bias control value in response to a transmitter output measurement and to a reference, the gain control circuit comprising:
      a measuring circuit configured to accept the transmitter output level and to supply a transmitter output measurement,
      a table of initial transmit bias control values cross-referenced to transmitter output levels, the table configured to accept a transmitter output level selection and to supply an initial transmit bias control value in response to the transmitter output level selection, and,
      a compensator configured to accept the adjusted transmit bias control value and the initial transmit bias control value and to supply a compensated transmit bias control value based on a difference between the adjusted transmit bias control value and the initial transmit bias control value.

2. The system of claim 1 the system further comprising:
   a thermometer having an output supplying temperature data; and, wherein the table has an input to accept the temperature data, the table having initial transmit bias control values cross-referenced to temperature.

3. The system of claim 1 wherein the table includes initial transmit bias control values cross-referenced to transmitter output frequency and the table having an input for accepting transmitter output frequency selections.

4. The system of claim 1 wherein the table accepts transmitter output level selections in accordance with advanced mobile phone service (AMPS) specifications.

5. The system of claim 4 wherein the transmitter generates a selected transmitter output level within 20 milliseconds.

6. The system of claim 1 wherein the measuring circuit accepts the transmitter output level as a voltage and supplies the transmitter output measurement as a binary number.

7. The system of claim 6 wherein the table includes initial transmit bias control values stored as binary numbers.

8. The system of claim 7 wherein the gain control circuit further includes:
   a calculator having an input accepting the output of the measuring circuit, an input accepting the output of the compensator, an input accepting the reference, and an output to supply the adjusted transmit bias control value as a binary number; and
   a converter with an input connected to the output of the calculator and an output supplying a control voltage, wherein the transmitter input accepts the converter output as a biasing signal.

9. The system of claim 8 wherein the compensator includes:
   an error circuit having an input connected to the calculator output, an input accepting initial transmit bias control values from the table, and an output supplying an error value associated with the initial transmit bias control value;
   a memory circuit having an input accepting the error value; and,
   a summing circuit having an input accepting the stored error value from the memory circuit, an input accepting another initial transmit bias control value from the table, and an output to supply the compensated transmit bias control value.

* * * * *